United States Patent
Muller

(12) 
(10) Patent No.: US 6,203,929 B1
(45) Date of Patent: Mar. 20, 2001

(54) GOLD PLATED SOLDER MATERIAL AND METHOD OF FLUXLESS SOLDERING USING SOLDER

(75) Inventor: Heinrich G. Muller, Culver City, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/294,264

(22) Filed: Apr. 19, 1999

Related U.S. Application Data

(62) Division of application No. 08/937,690, filed on Sep. 29, 1997, now abandoned.

(51) Int. Cl.⁷ .............................. B23K 35/26; B23K 35/34
(52) U.S. Cl. ......................... 428/643; 428/647; 428/672; 228/56.3
(58) Field of Search .................................. 428/643, 645, 428/646, 647, 672; 228/56.3

(56) References Cited

U.S. PATENT DOCUMENTS

| | | |
|---|---|---|
| 2,503,564 | 4/1950 | Reeve . |
| 3,392,442 * | 7/1968 | Napier et al. . |
| 4,645,116 * | 2/1987 | Henein et al. . |
| 4,817,849 * | 4/1989 | Yamamoto et al. . |
| 5,086,966 * | 2/1992 | Melton et al. . |
| 5,341,980 * | 8/1994 | Nishikawa et al. . |
| 5,384,204 | 1/1995 | Toshihiko et al. . |
| 5,622,305 * | 4/1997 | Bacon et al. . |
| 5,816,473 * | 10/1998 | Nishikawa et al. . |
| 5,878,943 * | 3/1999 | Nishikawa et al. . |
| 6,037,065 * | 3/2000 | Hajmrie et al. . |
| 6,119,920 * | 11/2000 | Guthrie et al. . |

FOREIGN PATENT DOCUMENTS

| | | |
|---|---|---|
| 2036794 | 7/1980 | (GB) . |
| 2221570 | 2/1990 | (GB) . |
| 61137697 | 6/1996 | (JP) . |

\* cited by examiner

*Primary Examiner*—Deborah Jones
*Assistant Examiner*—Jason Savage
(74) *Attorney, Agent, or Firm*—Michael S. Yatsko; Ronald M. Goldman

(57) ABSTRACT

A solder material 10 suitable for fluxless soldering attachment of a component 12 to a substrate 14 in a microelectronic assembly 16 such as a hybrid package comprises a core 18 and a gold layer 20 on the core. The core can comprise an alloy of tin and lead. The core preferably consists essentially of at least about 30 wt. % tin and the balance lead, so that it melts at temperatures of less than about 250° C. The gold layer is preferably applied to the core using an electroless plating process that forms a highly uniform gold layer. The solder material provides a joint between the component and the substrate comprising less than about 3 wt. % gold.

5 Claims, 3 Drawing Sheets

GOLD PLATED SOLDER MATERIAL AND METHOD OF FLUXLESS SOLDERING USING SOLDER

This application is a division of Ser. No. 08/937,690 filed Sep. 29, 1997, now abandoned.

BACKGROUND

The present invention is directed to the field of microelectronic packaging and, more particularly, to a gold plated solder material and a method of fluxless soldering attachment using the solder material.

Different types of components are commonly attached to substrates in microelectronic assemblies such as hybrid packages using eutectic attachment techniques. In a given hybrid package, different types of components are commonly attached to a substrate using different solder compositions. Typical metal alloy solder compositions that are used include gold-based alloys such as Au-Si, Au-Ge and Au-Sn. Such gold-based alloys do not oxidize in air and, consequently, do not require the use of fluxes to dissolve oxides and enable wetting of the joined surfaces. Fluxes are undesirable in soldering hybrid packages, however, due to the detrimental effects fluxes can have on certain components such as micro-optoelectronic devices.

Known gold-based solder compositions represent a range of eutectic temperatures. The different types of components in hybrid packages typically have upper temperature limits to which they can be heated during soldering without degrading the components. To avoid such degradation, the components are attached to the substrate using a soldering hierarchy approach, in which the components are soldered in the order of descending temperature resistance using different solder compositions in the order of descending processing temperature. For example, 96.4% Au-3.6% Si has a eutectic temperature of about 370° C. and is typically heated to a processing temperature of about 390–420° C. to form a eutectic bond between the component and the substrate. Components having an upper temperature limit above this processing temperature are attached first to the substrate using Au-Si solder. Au-Ge solder has a eutectic temperature below that of Au-Si solder and above that of Au-Sn solder. Accordingly, components having a temperature upper limit below the Au-Si solder process temperature range and above the Au-Sn process temperature are next attached to the substrate using the Au-Ge solder. This process is repeated until the soldering hierarchy is completed.

The present gold-based solders are less than completely satisfactory because they cannot be used in microelectronic assemblies such as hybrid packages to attach components having an upper temperature limit below the process temperature of Au-Sn solders. 80% Au-20% Sn solder has a eutectic temperature of about 280° C. and typically is heated to about 310–330° C. during soldering to ensure complete melting occurs. This processing temperature range can degrade some components.

Conventional solder compositions such as Sn-Pb solders have a sufficiently low process temperature for attaching such components, but these solders require fluxes to form a satisfactory joint. Accordingly, these solders are not suitable for use in hybrid packages that include micro-optoelectronic devices which can be degraded by fluxes.

Thus, there is a need for a solder composition and a method of using the solder composition to attach a component to a substrate in a microelectronic assembly such as a hybrid package that (i) does not require a flux; and (ii) melts at a relatively low temperature, making it suitable for attaching components at lower process temperatures than can be used for known gold-based solders.

SUMMARY

The present invention provides a solder material and a method of fluxless soldering attachment of a component to a substrate in a microelectronic assembly such as a hybrid package using the solder material that satisfies the above-described needs. The solder material comprises a core and a layer of gold covering at least a portion of the core. The core can comprise tin, lead and small amounts of other elements such as silver. The alloy preferably consists essentially of at least about 30 wt. % tin and the balance lead. This composition melts at temperatures of less than about 250° C. The solder material comprising this core composition can be heated to a temperature of less than about 280° C. to melt the core alloy and form a solder joint. The alloy preferably consists essentially of a eutectic composition of about 63 wt. % tin and about 37 wt. % lead that melts at the eutectic temperature of about 183° C. The solder material comprising this core composition can be heated to a low process temperature of less than about 230° C. to join the component and the substrate. Heating of the solder material is preferably conducted in an inert gas atmosphere.

The gold layer is preferably applied on the core using an electroless plating process. Electroless plating provides a gold layer having excellent coverage and thickness uniformity. The component and the substrate typically each also have a gold layer to prevent surface oxidation. The solder material has an effective thickness to provide a joint between the component and the substrate comprising less than about 3 wt. % gold. Higher percentages of gold can degrade the mechanical properties of the joint.

The method of attaching the component to the substrate in the microelectronic assembly comprises placing the solder material between the component and the substrate and heating the solder material to an effective temperature to melt the solder material and form a solder joint. The effective temperature depends on the composition of the core. The joint preferably comprises less than about 3 wt. % of gold.

Thus, the present solder material and method of attaching a component to a substrate in a microelectronic assembly (i) enables fluxless soldering; (ii) has a relatively low process temperature, making it suitable for attaching components in hybrid packages at lower temperatures than can be used for known gold-based solders; and (iii) forms a joint having a controlled gold content.

DRAWINGS

DESCRIPTION

Figure 1:
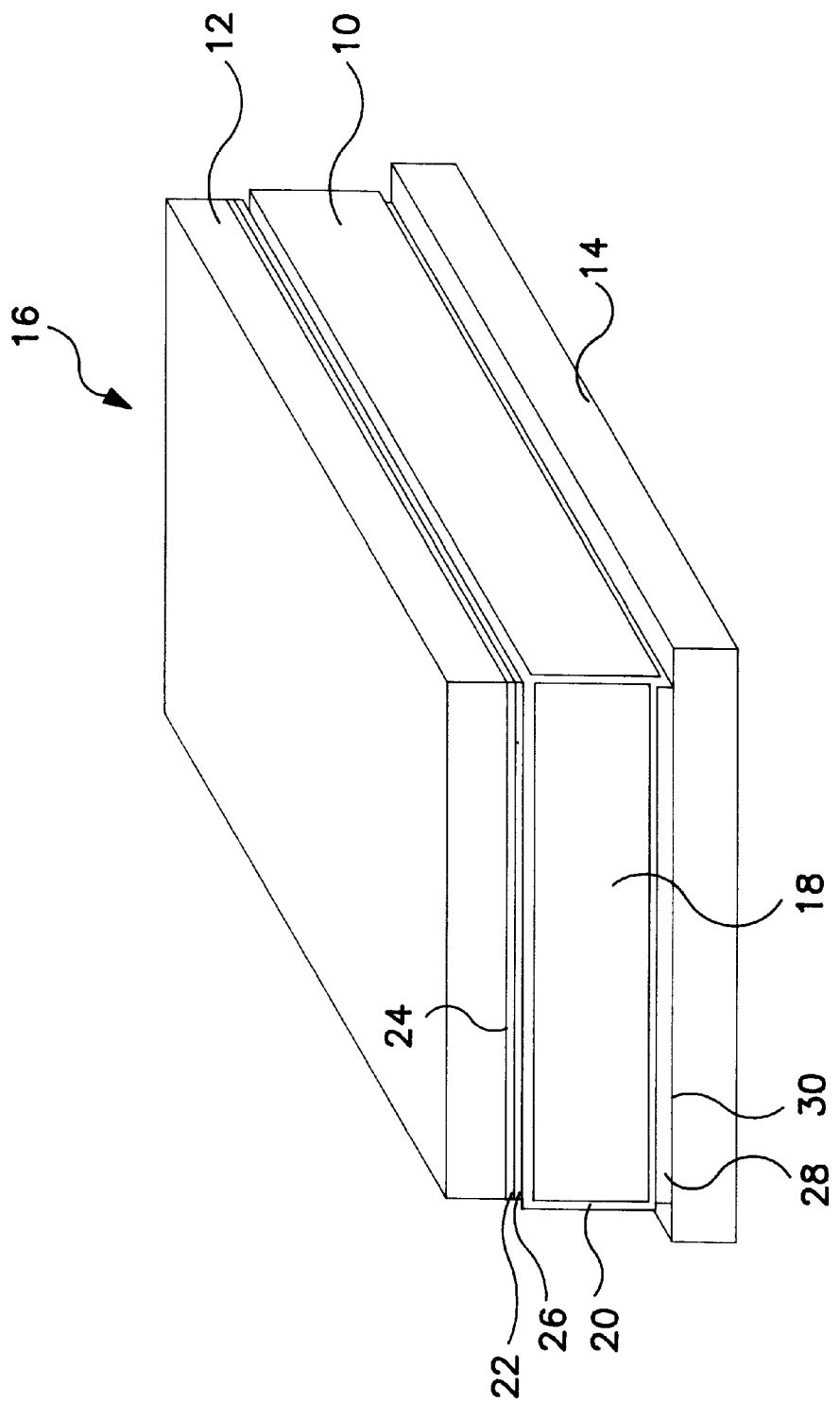
FIG. 1 illustrates a solder material according to the present invention disposed between a component and a substrate in a microelectronic assembly prior to the formation of a solder joint.

With reference to the drawings, FIG. 1 illustrates a solder material 10 in accordance with the present invention disposed between a component 12 and a substrate 14 supporting the component 12 in a microelectronic assembly 16 such as a hybrid package. The solder material 10 is shown prior to the formation of a solder joint between the component 12 and the substrate 14.

The component 12 can be, for example, a V-groove, modulator, waveguide, standard electronic component, microwave component, lens, fiber holder, transmitter, receiver, feedthrough or the like.

The substrate 14 can be, for example, a metallized ceramic, a metallized package or the like.

The solder material 10 comprises a core 18 and a layer 20 on the core 18. The core 18 can comprise tin (Sn) and lead (Pb). The layer 20 on the core 18 consists essentially of gold. The solder material 10 preferably has a melting temperature of less than about 250° C. and, accordingly, a process temperature of less than about 280° C. Typically, the solder material 10 is heated to a temperature that is from about 30° C. to about 50° C. above its melting temperature to ensure that complete melting occurs and a good solder joint is formed. An inert gas atmosphere is preferably used.

Figure 2:
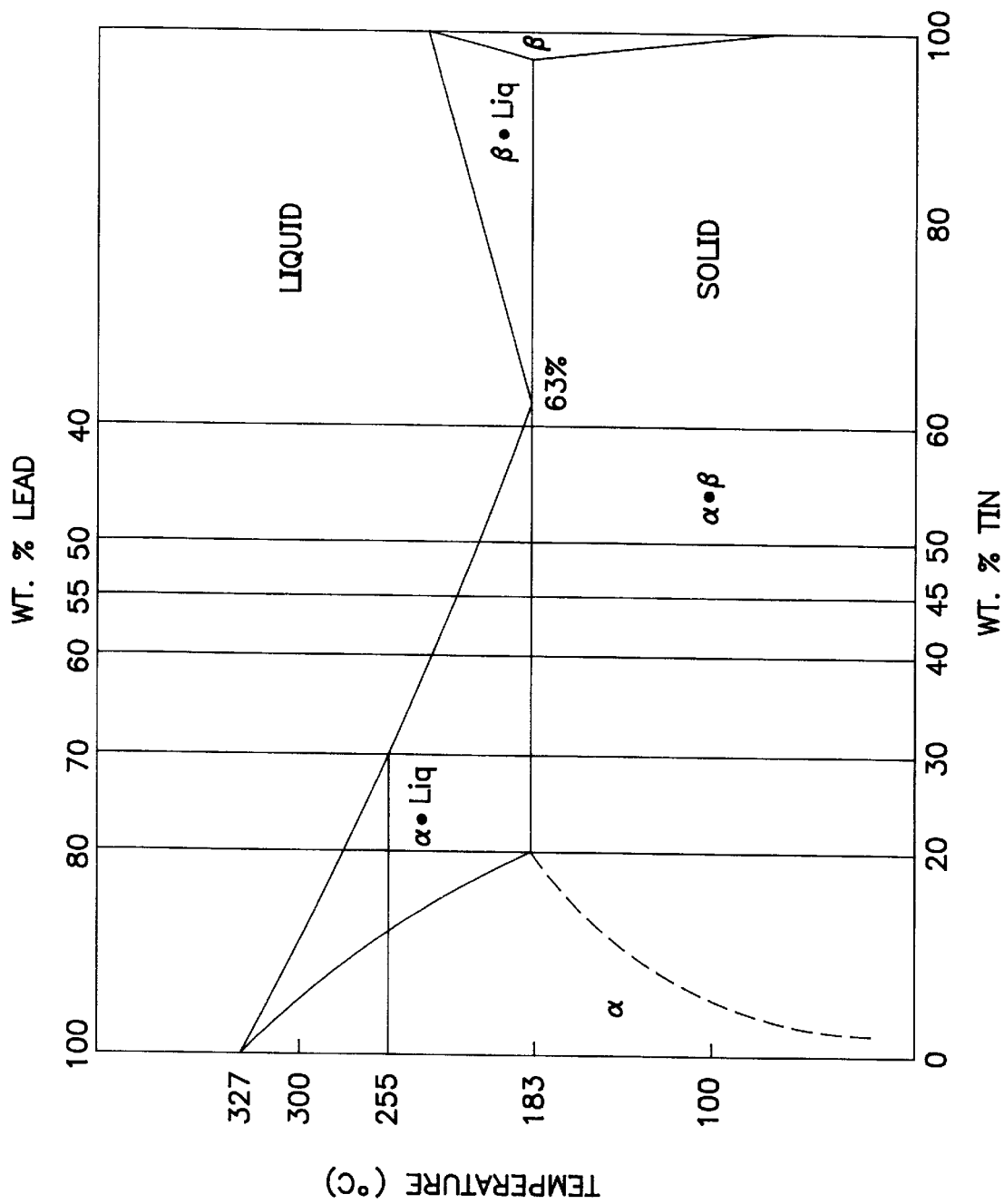
FIG. 2 illustrates the equilibrium tin-lead phase diagram.

The core 18 can consist essentially of at least about 30 wt. % tin and the balance lead. Referring to the tin-lead equilibrium diagram shown in FIG. 2, the liquidus temperature of an alloy consisting essentially of 30 wt. % tin and 70 wt. % lead is about 255° C. This composition melts over a temperature range of from about 183° C. (eutectic temperature) to about 255° C. Alloys between about 30 wt. % tin and the eutectic composition have a decreasing liquidus temperature. Alloys containing more than about 63 wt. % tin have an increasing liquidus temperature up to the melting temperature of tin, 232° C.

The core 18 preferably has the eutectic composition of about 63 wt. % tin and about 37 wt. % lead, so that the melting temperature of the core 18 is only about 183° C. The process temperature of this composition is less than about 230° C. This low process temperature enables the solder material 10 to be used to attach components that can be degraded during soldering with known gold-based solders. Accordingly, the solder material 10 can provide an additional low temperature step in the soldering hierarchy in the assembly 16.

Small amounts of less than about 1–5 wt. % of other elements such as silver can be added to tin-lead alloys comprising at least about 30 wt. % tin and lead to form the core 18. For example, an alloy consisting essentially of about 62.5 wt. % tin, 36.1 wt. % lead and 1.4 wt. % silver has a suitable low melting temperature of about 179° C. It is contemplated that small amounts of other elements that do not degrade the microstructure and mechanical properties of the solder joint can alternately be added to tin-lead alloys to form the core 18.

As described in greater detail below, the amount of gold in the solder joint is preferably maintained at less than about 3 wt. % to avoid problems associated with higher percentages. Gold levels below about 3 wt. % do not have a significant effect on the melting temperature of tin-lead alloys over the preferred composition range of the core 18. Accordingly, the process temperature of the solder material 10 can be approximated based on the melting temperature of the core 18.

The core 18 typically has a sheet configuration. As described below, the solder material 10 has an effective thickness so that it contains a sufficient amount of tin relative to the amount of gold in the solder joint to give the joint good mechanical properties.

The layer 20 of gold is preferably applied on the core 18 using an electroless plating process. An electroless plating process was performed to produce a gold plating layer on a core consisting essentially of about 63 wt. % tin and about 37 wt. % lead. The resulting gold layer had a highly uniform thickness of about 0.1 µm on substantially the entire outer surface of the core. The plating solution used to plate the core was OROMERSE MN available from Technic, Inc. Of Anaheim, Calif. The plating solution was mechanically agitated. The temperature of the solution was about 85° C., and the plating time was about two minutes.

The excellent adherence, substantially complete coverage and thickness uniformity of the gold plating on the core was unexpected in light of the well-known problems associated with plating gold on tin.

The gold layer 20 on the core 18 enables the solder material 10 to be used without a flux. The electroless plating process removes substantially all oxide from the outer surface of the core 18 during plating. The combination of the low melting temperature and fluxless soldering capabilities of the solder material 10 provide important advantages as compared to known gold-based solders. Particularly, the solder material 10 can be used to attach components in microelectronic assemblies that can be degraded by the process temperatures of known gold-based solders. The solder material 10 adds a step in the soldering hierarchy at process temperatures significantly below the lowest process temperatures that can be used with known gold-based solders (i.e., about 310° C.–330° C. as used for Au-Sn solders). The solder material 10 is particularly advantageous for use in hybrid packages which are hermetically sealed to prevent contamination. Fluxes can have detrimental effects on components in hybrid packages. Furthermore, the solder material 10 can be used in hybrid packages that include micro-optoelectronic devices without degrading the performance of such devices. The solder material 10 can be used to attach optoelectronic devices, and to attach other types of components in hybrid packages that include optoelectronic devices.

The component 12 typically has a diffusion barrier layer 22 on its lower surface 24 and a gold layer 26 on the barrier layer 22. The barrier layer 22 can be a nickel layer applied by an electroless plating process. The substrate 14 typically has a gold layer 28 on its upper surface 30. The gold layers 26, 28 are applied to prevent oxidation. The thickness of the layers 26, 28 is typically about 0.1 µm. It is known that the weight percentage of gold in tin-containing alloys has significant effects on the microstructure and mechanical properties of the alloys. Particularly, increasing the gold content coarsens tin-lead microstructures and reduces yield strength. Gold can form brittle $AuSn_4$ or $Au(Sn,Pb)_4$ intermetallic structures which align along shear directions under vibration shear conditions. In addition, gold promotes the formation of voids in gold-containing solder joints. Accordingly, the amount of gold in the solder material 10 is limited to reduce defects, to achieve a satisfactory low cycle fatigue life, and to reduce brittle fracture behavior in the solder joint. A gold level of less than about 3 wt. % in the solder joint formed using the solder material 10 is preferred to overcome these problems.

For about a 0.1 µm thickness of each of the gold layer 20 on the core 18, the gold layer 26 on the component 12, and the gold layer 28 on the substrate 14, the solder material 10 preferably has a thickness of at least about 50 µm. This thickness of the solder material 10 provides a sufficient amount of tin and lead in the resulting joint between the component 12 and the substrate 14 such that the joint comprises less than about 3 wt. % gold. A greater thickness of the solder material 10 can be used to further reduce the weight percentage of gold in the solder joint.

Figure 3:
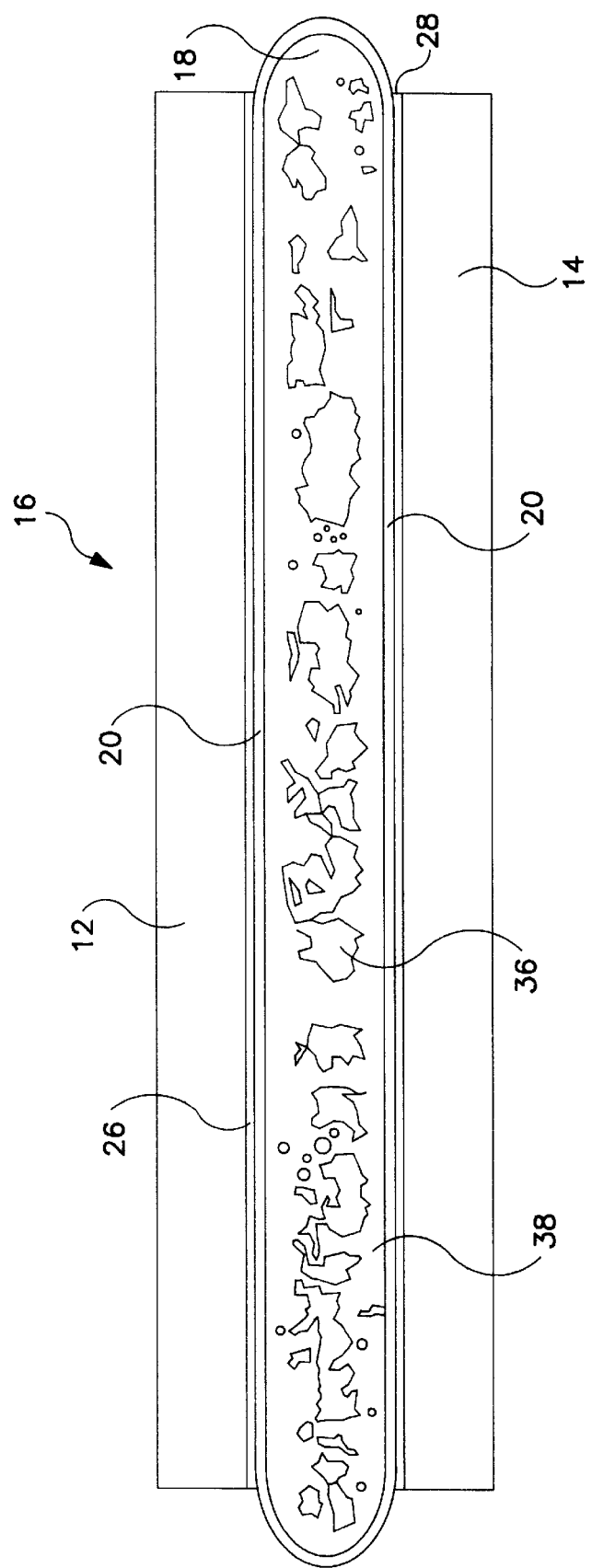
FIG. 3 illustrates the microstructure of the solder joint.

FIG. 3 illustrates the microstructure of a typical solder joint formed by a fluxless soldering method using the solder material 10 according to the present invention. As depicted, the gold layer 20 on the core 18 and the gold layer 26 on the component 12, the gold layer 20, and the gold layer 28 on the substrate 14 are dissolved in the molten solder. The core 18 comprises a lead-rich phase 36 and a tin-rich phase 38.

The gold layers 20, 26, and 28 prevent oxidation of all metal surfaces involved and enable the soldering process to be performed without a flux. Accordingly, the solder material 10 can be used to attach components such as micro-optoelectronic devices that can be degraded by fluxes. The solder material 10 also enables the attachment of components in assemblies on which micro-optoelectronic components are already present. The solder material 10 adds a lower temperature step in the soldering hierarchy than can be achieved with known gold-based solder materials.

Although the present invention has been described in considerable detail with reference to certain preferred versions thereof, other versions are possible. Therefore, the scope of the appended claims should not be limited to the description of the preferred versions contained herein.

What is claimed is:

1. A sheet of solder for application in fluxless soldering of a component to a substrate in a microelectronic assembly comprising:
    a) a core comprised of an alloy of tin and lead, said core having a thickness of no less than 50 $\mu$m; and
    b) a layer of electroless gold covering the entire core, said layer being no greater than 0.1 $\mu$m in thickness, and defining with said core a solder having a melting temperature under 280° C.

2. The solder material of claim 1, wherein said electroless gold layer is applied on the core using an electroless plating process.

3. A sheet of solder material comprising:
    a) a core consisting of an alloy of tin and lead in the proportion of 63% tin and 37% lead, said core having a thickness of no less than 50 $\mu$m; and
    b) a layer consisting of electroless gold covering the entire core, and wherein said sheet of solder material possesses a melting temperature of less than about 280° C.

4. The solder material of claim 3, wherein gold layer is applied on the core using an electroless plating process.

5. A sheet of solder material comprising:
    a) a core consisting essentially of about 63 wt. % tin and about 37 wt. % lead, said core having a thickness of no less than 50 $\mu$m; and
    b) a layer consisting of electroless gold substantially covering the core, wherein said electroless gold layer is applied on said core with an electroless plating process.

* * * * *